(12) United States Patent
Pelouard et al.

(10) Patent No.: US 8,519,443 B2
(45) Date of Patent: Aug. 27, 2013

(54) METHOD FOR MAKING A HETEROJUNCTION BIPOLAR TRANSISTOR

(75) Inventors: Jean-Luc Pelouard, Paris (FR); Melania Lijadi, Fontenay aux Roses (FR); Christophe Dupuis, L'Hay les Roses (FR); Fabrice Pardo, Vitry-sur-Seine (FR); Philippe Bove, Gif-sur-Yvette (FR)

(73) Assignees: Centre National de la Recherche Scientifique-CNRS, Paris (FR); S.O.I. Tec Silicon on Insulator Technologies, Bernin (FR)

( * ) Notice: Subject to any disclaimer, the term of this patent is extended or adjusted under 35 U.S.C. 154(b) by 597 days.

(21) Appl. No.: 11/988,575

(22) PCT Filed: Jul. 18, 2006

(86) PCT No.: PCT/FR2006/001760
§ 371 (c)(1),
(2), (4) Date: May 5, 2009

(87) PCT Pub. No.: WO2007/010135
PCT Pub. Date: Jan. 25, 2007

(65) Prior Publication Data
US 2010/0001319 A1 Jan. 7, 2010

(30) Foreign Application Priority Data
Jul. 18, 2005 (FR) .................... 05 07605

(51) Int. Cl.
*H01L 29/66* (2006.01)
*H01L 21/331* (2006.01)
(52) U.S. Cl.
USPC ........... 257/197; 257/198; 257/200; 257/201; 257/E29.033; 257/E29.035; 257/E29.185; 257/E29.188; 438/235; 438/312; 438/343; 438/349

(58) Field of Classification Search
USPC ................. 257/197, 198, 183, 565, 571–573, 257/586, 578, 592, 200, 201, E29.033, E29.035, 257/E29.185, E29.188; 438/235, 317, 354, 438/349, 312, 343
See application file for complete search history.

(56) References Cited

U.S. PATENT DOCUMENTS 4,801,993 A 1/1989 Ankri et al.
5,702,958 A * 12/1997 Liu et al. ....................... 438/309

(Continued)

FOREIGN PATENT DOCUMENTS

EP   1 211 737    6/2002
FR   2 772 187    6/1999

(Continued)

OTHER PUBLICATIONS

Goodhue, W.D., et al., "Monolithic two-dimensional surface-emitting strained-layer InGaAs/AlGaAs and AlInGaAs/AlGaAs diode laser arrays with over 50% differential quantum efficiencies"; Applied Physics Letters 59 (6):632-634, Aug. 5, 1991.

(Continued)

*Primary Examiner* — Kenneth Parker
*Assistant Examiner* — Jose R Diaz
(74) *Attorney, Agent, or Firm* — Harness, Dickey & Pierce, P.L.C.

(57) ABSTRACT

The invention concerns a heterojunction bipolar transistor comprising a support, and epitaxially grown from said support, at least: one collecting, respectively emitting, layer; at least one base layer; and at least one emitting, respectively collecting, layer. The collecting, respectively emitting, layer comprises: at least one first undercoat contacted with said base layer, substantially of similar composition as said emitting, respectively collecting, layer; and at least one second undercoat on the side opposite said base layer relative to said first undercoat.

25 Claims, 5 Drawing Sheets

(56) References Cited

U.S. PATENT DOCUMENTS

| | | | |
|---|---|---|---|
| 5,789,301 A * | 8/1998 | Hill | 438/319 |
| 5,907,165 A | 5/1999 | Hamm et al. | |
| 6,165,859 A | 12/2000 | Hamm et al. | |
| 6,445,009 B1 | 9/2002 | Grandjean et al. | |
| 6,593,604 B2 * | 7/2003 | Ishimaru | 257/197 |
| 6,730,943 B2 | 5/2004 | Massies et al. | |
| 6,825,508 B2 * | 11/2004 | Fujita et al. | 257/197 |
| 6,903,387 B2 * | 6/2005 | Hase | 257/197 |
| 7,323,721 B2 | 1/2008 | Liao et al. | |
| 7,767,307 B2 | 8/2010 | Semond et al. | |
| 7,785,991 B2 | 8/2010 | Joblot et al. | |
| 2002/0105004 A1 | 8/2002 | Hori et al. | |
| 2002/0139984 A1 | 10/2002 | Sugawara et al. | |
| 2003/0006430 A1 | 1/2003 | Shibata et al. | |
| 2004/0124436 A1 * | 7/2004 | Feng et al. | 257/197 |
| 2004/0214401 A1 | 10/2004 | Krueger et al. | |
| 2004/0227155 A1 | 11/2004 | Hase | |
| 2005/0082543 A1 | 4/2005 | Alizadeh et al. | |
| 2005/0085044 A1 * | 4/2005 | Hulsmann | 438/312 |
| 2006/0039437 A1 | 2/2006 | Albrecht et al. | |
| 2006/0124917 A1 | 6/2006 | Miller et al. | |
| 2010/0001319 A1 | 1/2010 | Pélouard et al. | |

FOREIGN PATENT DOCUMENTS

| | | |
|---|---|---|
| FR | 2 796 657 | 1/2001 |
| FR | 2 803 433 | 7/2001 |

OTHER PUBLICATIONS

Lee, Sung-Nam, et al., "Monolithic InGaN-based white light-emitting diodes with blue, green, and amber emissions"; Applied Physics Letters 92, 081107 (1-3) (2008).

Qi, Y.D., et al., "Dual wavelength InGaN/GaN multi-quantum well LEDs grown by metalorganic vapor phase epitaxy"; Journal of Crystal Growth 272 (2004) 333-340.

Yamada, Motokazu, et al., "Phosphor Free High-Luminous-Efficiency White Light-Emitting Diodes Composed of InGaN Multi-Quantum Well";Jpn. J. Applied Physics vol. 41 (2002) pp. L246-L248, Part 2, No. 3A, Mar. 1, 2002.

Damilano, B. et al.; "Monolithic White Light Emitting Diodes Based on InGaN/GaN Multiple-Quantum Wells;" The Japan Society of Applied Physics, vol. 40, Pt. 2, No. 9A/B, Sep. 15, 2001; pp. L918-L920.

Haase, M.A. et al.; "II-IV Semiconductor Color Converters for Efficient Green, Yellow, and Red Light Emitting Diodes.;" Applied Physics Letters 96, 2010; pp. 231116-1-231116-3.

Damilano, B. et al.; "Monolithic White Light Emitting Diodes Using a (Ga,In)N/GaN Multiple Quantum Well Light Converter;" Applied Physics Letters 93, 2008; pp. 101117-1-101117-3.

Kalliakos, S. et al.; "Photoluminescence Energy and Linewidth in GaN/A1N Stackings of Quantum Dot Planes;" Journal of Applied Physics, American Institute of Physics, New York, US, vol. 96, No. 1, XP012067946, ISSN: 0021-8979 (the whole document) Jul. 1, 2004; pp. 180-185.

* cited by examiner

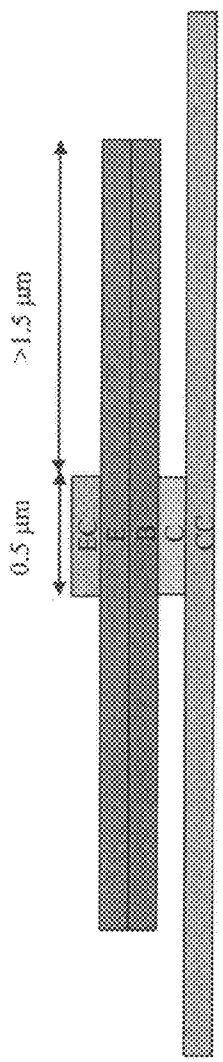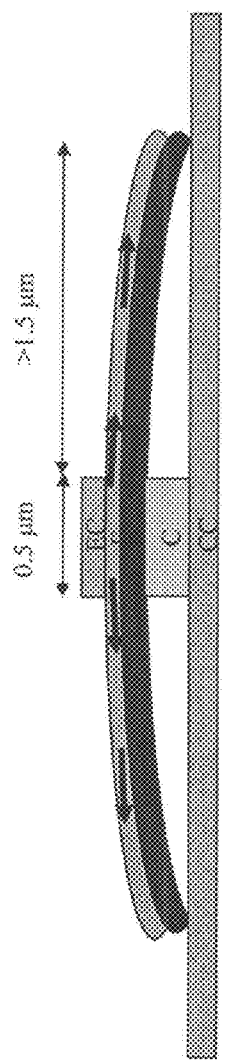

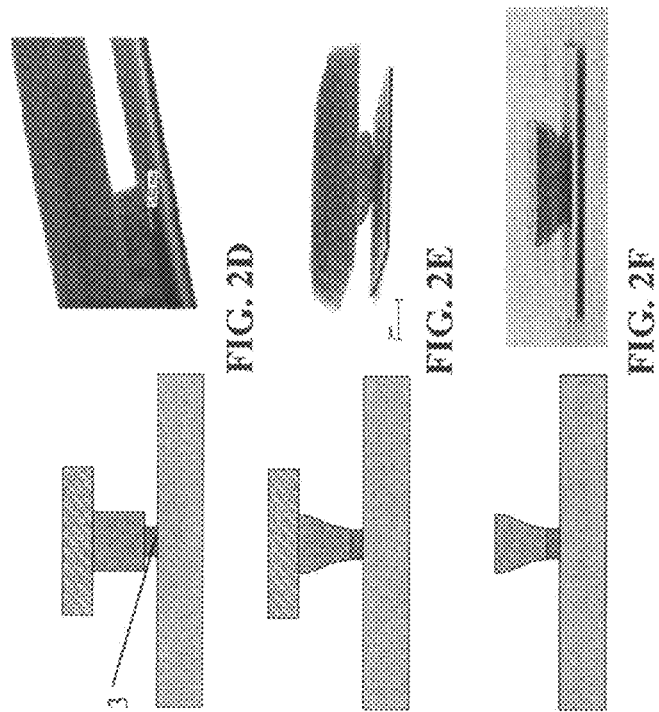
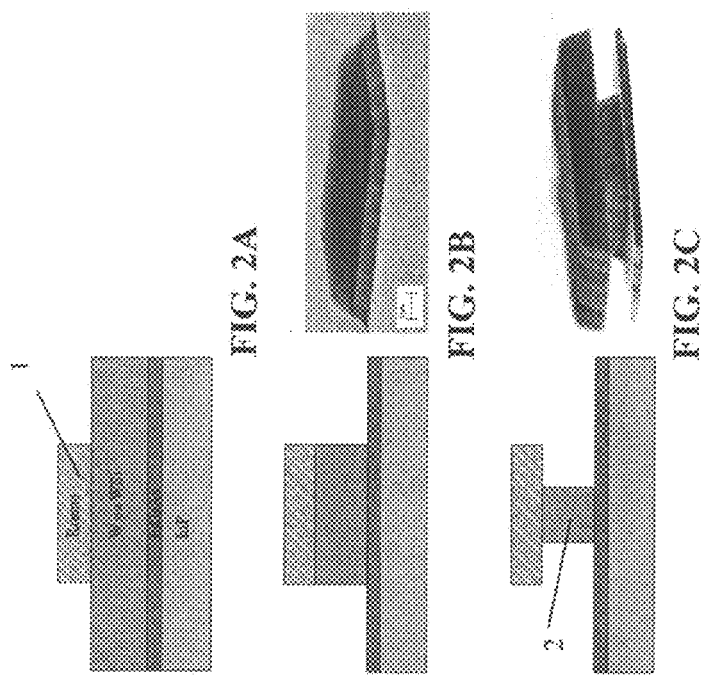

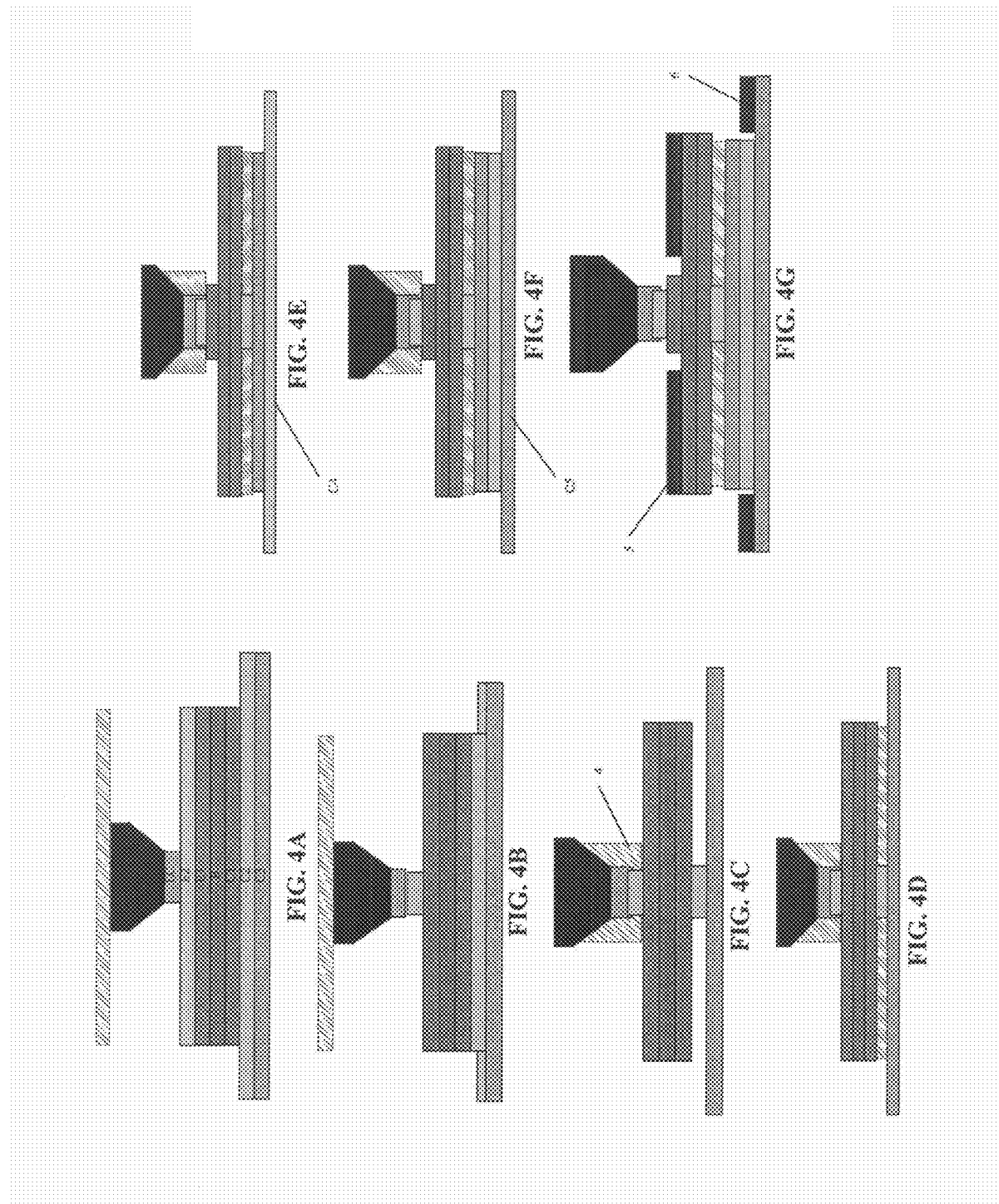

METHOD FOR MAKING A HETEROJUNCTION BIPOLAR TRANSISTOR

CROSS-REFERENCE TO RELATED APPLICATIONS

This application is a National Phase Entry of International Application No. PCT/FR2006/001760, filed Jul. 18, 2006, claiming priority to FR 05/07605, filed Jul. 18, 2005, both of which are incorporated by reference herein.

BACKGROUND AND SUMMARY

The present invention relates to a method for making a heterojunction bipolar transistor by stacking epitaxial semiconductor layers, and more particularly such a method comprising steps consisting of epitaxially growing from a support at least one collecting layer (for an E-up configuration) and one emitting layer (for a C-up configuration) respectively, at least one base layer, and at least one emitting layer and one collecting layer respectively.

A heterojunction bipolar transistor is made up of a stack of three semiconductor regions: emitter, base and collector, wherein the emitter has a forbidden energy gap wider than that of the base. Its lateral extension (in each of the planes of the preceding regions) is made up of two zones: one, called intrinsic or active, is defined by the surface of the emitter-base junction; the other, called extrinsic or parasitic, is located in the periphery of the former, between it and the electrical contacts (base and collector) of the transistor. The speed of the HBT is optimised by jointly reducing, on the one hand, the transit time of the carriers between the emitter and the collector and, on the other hand, the parasitic effects (serial resistors and capacitors) associated with the extrinsic zone. Transit time can be reduced through various approaches, widely described in existing literature: ballistic injection in the base (abrupt heterojunction type I), thin base, doping and/or concentration gradient in the base (quasi-electric field), thin collector, ballistic injection in the collector (type-II abrupt heterojunction), Schottky collector, etc. The reduction of parasitic effects is, in general terms, obtained by reducing the width of the peripheral zone and by using suitable materials (i.e. low resistivity for access resistors, low electric permittivity for the capacitors). The present invention makes it possible to reduce the base-collector capacity by means of the reduction of transit time described above.

The invention effectively makes it possible to produce HBTs, in particular with a GaAsSb base layer, having both a thin and limited base and a deeply underetching base-collector junction. These two points, until now incompatible in the same transistor, allow for a considerable improvement of its dynamic performance. The first point mainly affects the conditions of electronic transport (band discontinuity at the emitter-base interface, effective mass of the carriers, resistivity of the base, resistivity of the base contact, etc.) while the second point enables a drastic reduction of the base-collector parasitic capacity (i.e. associated with the extrinsic part of the base-collector junction), the parasitic capacity limiting the operating frequency of the HBT.

GaAsSb HBTs are known from the document "Ultra-high performance staggered lineup ("Type-II") InP/GaAsSb/InP npn Double Heterojunction Bipolar Transistor" C. R. Bolognesi, M. W. Dvorak, N. Matine, O. J. Pitts and S. P. Watkins, Jpn. J. Appl. Phys. Vol. 41 Part 1(2B) 1131 (2002). These transistors have shown remarkable results ($f_T = f_{max} = 300$ GHz) and clear progress compared with the state of the art at the time, obtained with InP/InGaAs structures. The same authors have shown that the antimony composition used in the base layer was considerably lower than the concentration ensuring lattice match with InP ([Sb]=0.5). The technology used has limited the underetching of the collecting layer to 750 nm under the base contact, while the latter overhangs the emitter finger by 1.5 μm. A comparison between the experimental results and those resulting from the simulation shows clearly superior performance (i.e. >500 GHz) for a unit report of the emitter-base and base-collector junction areas. Finally, the contribution of the GaAsSb to the speed of the transistor is clearly established.

The document "InP/InGaAs SHBTs with 75 nm collector and fT>500 GHz" W. Hafez, Jie-Wei Lai and M. Feng, Electron. Lett. 39(20) (2003) also describes an InP/InGaAs stack allowing frequencies in excess of 500 GHz to be obtained. These results have shown the importance of reducing both the electron transit time by reducing the thickness of the various semiconductor layers (in particular the collecting layer) and the lateral dimensions of the component. A GaAsSb HBT typically has the structure shown in table 1 below.

Throughout the production of the transistor, the InP layer of the collector is laterally etched to a considerable depth in order to reduce the base-collector capacity. This etching is only possible by chemical means, as no dry etching is sufficiently anisotropic for this purpose. The very high selectivity of InP chemical etching is used compared with arsenides (in this case GaAsSb and InGaAs) in, for example, a solution of $H_3PO_4$:HCl.

As the base is very thin (typically between 20 and 50 nm), it is not rigid enough to support itself over a sufficient length (typically 1.5 to 2 μm). The known manufacturing process therefore contemplates preserving the emitting layer E with the same dimensions as the base B during the underetching of the InP layer located in the collector C (FIG. 1a). At this stage in the progress of the method, the structure as known until now is seriously flawed if the GaAsSb base has an antimony content of less than 50%. Indeed, as the emitter (InP or InGaAlAs) must necessarily be epitaxially grown at the lattice match with InP, there is a considerable gap in the lattice parameter (lack of lattice match) between the two layers constituting the base overhang (E and B FIG. 1a) overhanging the InP underetching. Under the action of this constraint, the overhang deforms (FIG. 1b) and can create a short-circuit between the base and the collector and, in any case, make it difficult to introduce resin between the base layer and the collector contact layer CC.

For these reasons, the skilled person in the art generally limits himself only to etching stacks made with materials that have lattice match between them, which is to say, stacks that do not have any constraints. This is the disadvantage that the present invention aims to solve by introducing a new layer of InGaAlAs quaternary in the collector. The symmetry (even approximate) of the stack of layers in the base overhang balances the constraints and considerably reduces deformations. In addition, it is known to modify the composition of the semiconductor to make the base layer, so as to considerably modify the electronic transport properties in the active zone of the transistor.

The invention guarantees compatibility between the performance of a deep underetching and the existence of a constraint in the base layer. The invention also aims to make it possible to use, in a HBT, a base made up of a semiconductor alloy in which the molecular arrangement (depending on the composition of the alloy) does not correspond to the lattice match required by the emitting or collecting layer. For example, the invention supports the use of a base made from GaAsSb alloy, with an antimony ratio higher or lower than 50%.

American patent application US-2004/0227155 A1 is known in the prior art, which suggests introducing an In Ga As Sb underlayer between the base layer and the collecting layer so as to improve the properties of the HBT. The HBT thus made does not have any constraints relating to a lack of lattice match, even before introducing the underlayer. Also known is patent application US-2004/0214401 A1, which describes a method for passivating a HBT by epitaxy of a semiconductor on its entire surface. Finally, U.S. Pat. No. 6,165,859 is known, which describes the production of low-resistivity contacts using Pd/Pt/Au.

The invention relates above all to a method for making a heterojunction bipolar transistor by stacking epitaxially grown semiconductor layers, comprising steps consisting of epitaxially growing from a support at least one collecting layer and one emitting layer respectively, at least one base layer, and at least one emitting layer and one collecting layer respectively, said layers having compositions producing a lattice match fault causing deformations. According to the invention, the step consisting of epitaxially growing said collecting layer and emitting layer respectively comprises sub-steps consisting of epitaxially growing, in contact with said base layer, at least one underlayer for balancing the constraints and reducing the deformations and, in particular, an underlayer with substantially the same composition as said emitting layer and collecting layer respectively and at least one second underlayer on the side opposite said base layer in relation to said first underlayer.

In a specific embodiment of the invention, for making a transistor in which said emitting layer and said collecting layer respectively comprise two underlayers including a first underlayer in contact with the base layer and a second underlayer on the side opposite said base layer in relation to said first underlayer, said first underlayer of the collector and emitter respectively has substantially the same composition as the first underlayer of the emitter and the collector respectively. The invention also relates to a heterojunction bipolar transistor comprising a support and, epitaxially grown from this support, at least:

one collecting layer and one emitting layer respectively;
at least one base layer; and
one emitting layer and one collecting layer respectively;
said layers having compositions producing a lattice match fault causing deformations.

According to the invention, said collecting layer and emitting layer respectively comprise:

at least one first underlayer in contact with said base layer, for balancing the constraints caused by said emitting layer and collecting layer respectively in particular an underlayer with substantially the same composition as said emitting layer and collecting layer respectively; and
at least one second underlayer on the side opposite said base layer in relation to said first underlayer.

In a specific embodiment, said second underlayer is underetched to a minimum lateral extension comprised between that of the base and that of the emitter-base and collector-base junction respectively. Optimally, this lateral extension will be of the order of that of the emitter-base and collector-base junction respectively. In practice, however, it will be slightly larger, but naturally smaller than that of the base.

Also in a specific embodiment, said emitting layer and collecting layer respectively comprise:

at least one first underlayer in contact with said base layer, substantially of said composition; and
at least one second underlayer on the side opposite said base layer in relation to said first underlayer.

In a specific embodiment, said second underlayer is underetched to a lateral extension of the order of that of the emitter-base and collector-base junction respectively.

Said emitting layer and collecting layer respectively can, in particular, comprise:

at least one first underlayer in contact with said base layer, substantially of said composition; and
at least one second underlayer on the side opposite said base layer in relation to said first underlayer.

The invention also relates to a method for making a transistor such as previously described, said method comprising the steps consisting of:

epitaxially growing said layers and underlayers;
etching the layers above said emitting layer and collecting layer respectively;

said method also comprising the steps consisting of:

underetching said second underlayer and of the collector and emitter respectively;
filling the space left by said underetching between said first underlayer of the collector and emitter respectively and the layer located under the second underlayer with an insulating material; and
etching said emitting layer and collecting layer respectively.

In one specific embodiment, to make a transistor comprising a contact layer of the emitter and collector respectively and a metal contact, this method comprises the step consisting of encapsulating said contact of the emitter and the collector respectively and the metal contact in a material to protect it against etching. To make a transistor in which said emitting layer and collecting layer respectively comprise two underlayers in which a first underlayer is in contact with the base layer and a second underlayer is on the side opposite said base layer in relation to said first underlayer, the step consisting of etching the layers above said emitting and collecting layer respectively is followed by a step consisting of etching the second underlayer of the emitter and collector respectively. In a specific embodiment, the encapsulation step includes encapsulating the non-etched part of the second underlayer of the emitter and collector respectively, placed between the first underlayer of the emitter and collector respectively and the contact layer of the emitter and collector respectively. The invention also relates to a transistor such as described above, wherein:

said base layer is made from GaAsSb;
said first underlayers are made from InGaAlAs; and
said second underlayers are made from InP.

Finally, the invention relates to a use of underlayers for balancing constraints generated by epitaxially grown layers which are stacked on top of one another, the stacking having lattice match faults between the epitaxially grown layers due to their composition and, in particular, due to the composition of the base layer.

BRIEF DESCRIPTION OF DRAWINGS

The following is a description, given by way of non-limiting example, of a method for making a specific transistor according to the invention, in reference to the appended diagrammatic drawings, wherein:

FIG. 1 depicts the state of the art, the dimensions being given (in μm) only by way of example;

FIG. 2 depicts the steps in the method for making metal contacts;

FIG. 4 depicts the steps of etching the semiconductor layers.

DETAILED DESCRIPTION

Figures 3A, 3B, 3C, 3D:
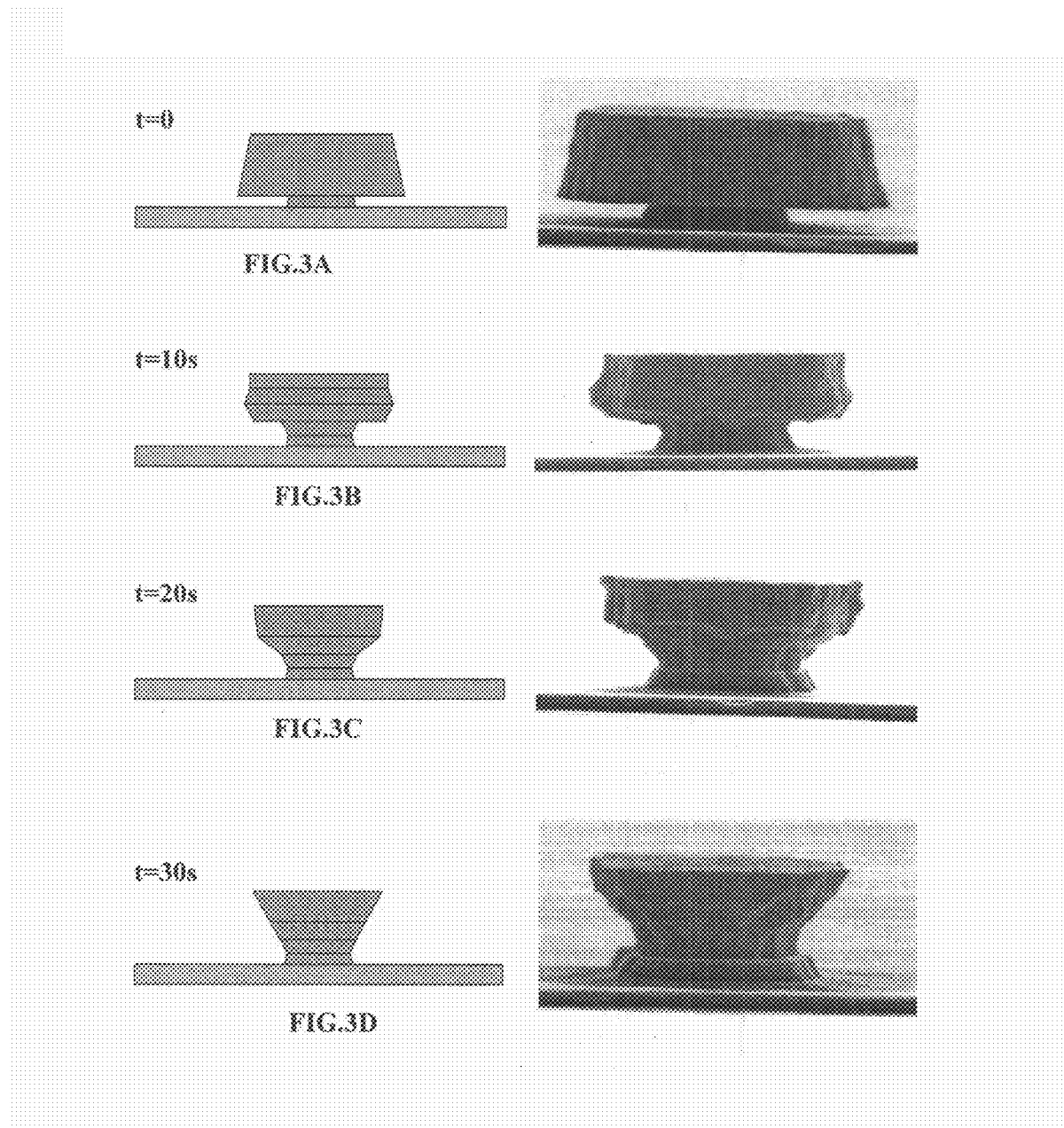
FIG. 3 shows the evolution of the shape of the contact throughout the step shown in FIG. 2 f)

The following is a description of the method in an application for making ultra-rapid heterojunction bipolar transistors (HBT) (f>500 GHz), but it can be applied to the production of other devices. The overall method comprises three major groups of steps: making the epitaxially grown stack, making the metal contacts and etching the semiconductor layers.

Making the Epitaxially Grown Stack

The first steps of the method according to the invention, described here in the context of an E-up configuration (emitter at the top), consist of epitaxially growing in a well known manner, the semiconductor materials used to make the HBT. These steps are implemented layer by layer on a substrate (in this case InP) which imposes its crystalline lattice on the entire structure. An example of the characteristics of the various layers is provided in the following table:

TABLE 1

| Layer | Material | Typ. doping (cm − 3) | Typ. thickness (nm) |
|---|---|---|---|
| EC emitting contact | InGaAs | >1 × 10$^{19}$ | 100 |
| E2 emitter 2 | InP | >1 × 10$^{17}$ | 50 |
| E1 emitter 1 | InGaAlAs | 3 – 10 × 10$^{17}$ | 30 to 70 |
| B base | GaAsSb | >5 × 10$^{19}$ | 20 to 50 |
| C1 collector 1 | InGaAlAs | 5 × 10$^{16}$ | 50 to 100 |
| C2 collector 2 | InP | 5 × 10$^{19}$ | 100 to 200 |
| C3 coll. etch-stop | InGaAs | >1 × 10$^{19}$ | 10 to 50 |
| C4 coll. etch-stop | InP | >1 × 10$^{19}$ | 10 to 50 |
| C5 collector contact | InGaAs | >1 × 10$^{19}$ | 10 to 50 |

The following detailed description only relates to the layers located next to the base layer. The base layer is made from GaAsSb. It is very heavily p-type doped with carbon (>5× 10$^{19}$ cm$^{-3}$). Its thickness depends on the level of doping chosen, and can vary between 20 and 50 nm. It can have any antimony content (typically comprised between 25 and 75%). The antimony content, like the doping level, can have a gradient for reducing the electron transit time in the base.

GaAsSb is a particularly suitable material for the following reasons:

It has very high discontinuity in the valence band with the materials with a wide forbidden energy gap available on the InP substrate (0.79 eV with InP, 0.63 eV with InAlAs) compared with kBT which, regardless of the doping level of the base and the material used in the emitter, renders the current of holes injected in the emitter negligible compared with that carried by the electrons injected in the base.

It can have a very high level of p-type doping replacing the V-site atoms with carbon atoms. The carbon doping limit is higher than 2×10$^{20}$ cm$^{-3}$. In this doping range, the mobility of the holes, measured by the Hall effect, is constant. Any doping increase therefore results in an equivalent increase of electric conductivity in the base layer. As the carbon diffusion coefficient in GaAsSb is very low, the doping profiles after epitaxy are abrupt and the aging effects of the transistor observed with other dopants (e.g. beryllium) are considered to be negligible.

With the InGaAlAs quaternary alloy it has a discontinuity in the conduction band which is positive (i.e. type I) when the aluminium content (concentration in relation to all the III sites) is greater than 38.5% and negative (i.e. type II) in the opposite case. This introduces a great flexibility to the design of the structure.

It has Fermi-level trapping on the surface located in the forbidden energy gap at 0.22 eV from the valence band, which has two major consequences for the HBT: on the one hand, the specific resistivity of the ohmic contacts made on this layer (base contact) is very low (pc<10$^{-6}$ Ωcm$^2$), on the other hand, the surface recombination speeds (recombination on the surface of the extrinsic base) are negligible.

It has very good adaptability to the crystalline lattice, imposed on it by the subjacent semiconductor layer. This property, due to the presence of antimony, makes it possible to epitaxially grow a GaAsSb layer with a greatly variable antimony content on semiconductors that have lattice match with InP. A transistor effect has been shown in HBTs having an antimony content in the GaAsSb base which can range between 50% (lattice match with InP), 25% (in tension on InP) and 75% (in compression on InP). This very high flexibility (unique in all the III-V semiconductors) provides considerable possibilities for modifying the fundamental lattice parameters (effective mass, band discontinuities, useful life, etc.) which considerably affect the performance of the HBT. In particular, for each of the properties mentioned above, there is a concentration that ensures optimum effects.

The emitting layer, adjacent to the base layer, is made from InP or from InGaAlAs quaternary alloy, or even as in this case, in the form of two underlayers, namely a first underlayer made from an InGaAlAs quaternary alloy in contact with the base layer and a second InP underlayer opposite the base layer in relation to the first underlayer. An InGaAlAs quaternary is preferably chosen, with an aluminium content of more than 38.5% (e.g. InAlAs) so as to create a ballistic injection of electrons in the base. Its doping level is chosen between 3 and 10×10$^{17}$ cm$^{-3}$. Its thickness can vary within quite a large range, with a typical value of around 30 to 70 nm.

The collecting layer is made from two materials. The first underlayer adjacent to the base is made from an InGaAlAs quaternary alloy. It has an aluminium content of less than 38.5% to avoid problems relating to the selective collection of type-I heterojunctions. An aluminium content of around 25-30% is preferably chosen so as to create a ballistic injection of electrons in the base-collector junction (⊗ Ec comprised between 90 and 150 meV). Its doping level (typically 5×10$^{16}$ cm$^{-3}$) is chosen so that the current density at the threshold of the Kirk effect is higher than the collector current density required to attain the desired frequencies. Its thickness (typically between 50 and 100 nm) is the result of a compromise between transistor speed (low thickness and therefore low transit time) and mechanical strength of the base overhang as well as the resistance to tension of the transistor.

The second underlayer of the collecting layer is made from InP. This is the part that, as will be seen below, is heavily underetched (selective chemical etching) so as to reduce the base-collector capacity of the HBT. It is heavily n-type doped (typically 1×10$^{19}$ cm$^{-3}$). It thickness (typically between 100 and 200 nm) is sufficient to guarantee suitable conditions for chemical etching. The other layers of the stack comprise, between the substrate and the second collector underlayer, a collector contact layer made from InGaAs, and a first and second etch-stop layer, respectively made from InP and InGaAs and, above the second emitter underlayer, an emitter contact layer.

Making the Metal Contacts

The following steps of the method consist of making the metal contact on the emitter contact layer. A layer of tungsten is first of all deposited evenly on the surface of the stack of epitaxially grown layers in which the HBT will subsequently be etched (or any other stack of semiconductor layers). Tungsten is chosen for a number of reasons:

It forms an ohmic contact with low specific resistivity with the very heavily n-type doped semiconductor (typically InGaAs) located at the top of the HBT stack in the E-up or C-up configurations.

It forms an excellent Schottky contact (i.e. low leakage current) with the lightly n-type doped semiconductor located at the top of the HBT stack in the C-up configuration.

Its refractory nature guarantees very good resistance to temperature increases. It can withstand, without any damage to itself or to the subjacent semiconductor, the various annealings inherent in the transistor production process (including possible ion implantation and its high-temperature annealing (>700° C.)).

Its very low coefficient of diffusion in the semiconductors makes it a perfect candidate for increasing the reliability of the component and, thus, its industrial impact. The same method can be used with a layer of tungsten silicide WSi, material widely used in the silicon industry due to its electric conductivity, which is greater than that of tungsten.

A mask 1 is made on the surface of the tungsten using one of the numerous methods known in semiconductor technology (FIG. 2a). It is possible, for example, to use a photosensitive resin mask with a shape defined by UV photolithography. The choice of material for the mask is actually very broad (electrosensitive resin, numerous metals and dielectrics) since it is sufficient for it to resist the two chemical solutions (in the case of the present example) which will be used subsequently to etch first the tungsten and then the semiconductor. This point facilitates the insertion of this method in the complex device production chain.

A first etching of the tungsten layer transfers the geometry of the mask to the tungsten layer (FIG. 2b). Reactive dry etching is used (fluorine ions) making it possible to obtain flanks which are slightly tilted in relation to the surface normal. Then, the tungsten layer is underetched by selective chemical means (known KOH-based solution) so as to define a first outline 2 of its shape (FIG. 2c).

This outline is "generally cylindrical" but, in every case, the tungsten flanks resulting from these etchings point slightly outwards. It can be assumed that thorough optimisation of the chemical and reactive dry etching (RIE) processes can lead to almost-vertical flanks. In no case would it lead to inward-pointing flanks. These outward-pointing flanks are incompatible with the self-aligned technology required for making ultra-rapid HBTs. Indeed, this profile would result, when making the metal deposits constituting either the base and collector ohmic contacts or the contact output bridges, in the appearance of short-circuits between the emitter and the base.

The next step consists of etching and then underetching, by selective chemical means, the first semiconductor layer 3 of the epitaxial stack (FIG. 2d). This introduces a constraint in the design of the stack of these layers. In the case of the HBT of the InP die, this constraint is very low since the contact layer is still made from InGaAs (for the very low resistivity of the ohmic contact that can be made with it). It is then a matter of placing a semiconductor layer under the InGaAs layer, which, without affecting the electrical properties of the component, will act as an etch-stop layer for the chemical etching. On the other hand, the latter layer must be chosen from among semiconductors with a wide forbidden energy gap (principle of the TBH) which have lattice match with the other semiconductor layers. For each of these semiconductors (InP, InGaAlAs, InGaAsP in the InP die, or AlGaAs, InGaP in the GaAs die) chemical solutions are known very preferably for etching InGaAs in relation to these materials.

Figure 3E:

The next step consists of chemically etching the flank of the tungsten layer to obtain the desired profile and dimensions (FIG. 2e). The existence of the underetching of the InGaAs layer allows the chemical solution to etch the tungsten on its lower face. It is this joint etching of the lower face and of the flank that will make it possible to obtain the desired profile. Once the thickness of the tungsten layer has been set (for example a thickness of 400 or 600 nm) the dimensions of the profile are obtained by controlling the etching time (FIG. 3). The quality of this control is then subject to the etching speed of the chemical solution used as well as to the roughness of the tungsten flank after etching.

It can be seen that the method described above for making the metal contact of the emitter (or of the collector in the C-up configuration), in the context of the previously described specific epitaxial stack can also be applied to conventional stack of the following type:

TABLE 2

| Layer | Material | Typ. doping (cm − 3) | Typ. thickness (nm) |
|---|---|---|---|
| EC emitting contact | InGaAs | $1 \times 10^{19}$ | 100 |
| E emitter | InGaAlAs | $3 \times 10^{17}$ | 50 |
| B base | GaAsSb | $5 \times 10^{19}$ | 20 to 50 |
| C collector | InP | $5 \times 10^{16}$ | 100 |
| CC coll. contact | InGaAs | $1 \times 10^{19}$ | 50 |

The previously described method can also be applied to the following stack:

TABLE 3

| Layer | Composition | Doping (cm − 3) | Thickness (nm) | Comments |
|---|---|---|---|---|
| Contact | InGaAs:Si | $>1 \times 10^{19}$ | 20 | |
| Emitter | InGaAlAs:Si | $3 \times 10^{17}$ | 50 | [Al] = 0.35 low In content |
| Base | GaAsSb:C | $8 \times 10^{19}$ | 35 | [Sb] = 0.39 |
| Collector 1 | InGaAlAs:Si | $5 \times 10^{16}$ | 60 | [Al] = 0.25 high In content |
| Collector 2 | InP:Si | $5 \times 10^{16}$ | 100 | |
| Sub-collector | InP:Si | $1 \times 10^{19}$ | 200 | |
| Coll. Contact | InGaAs:Si | $1 \times 10^{19}$ | 30 | |
| Damper | — | n.i.d. | — | |
| Substrate | InP:Fe (Si) | — | — | |

Etching of Semiconductor Layers

The dimensions of the extrinsic base are defined according to any known method. The production of the transistor continues with the following steps. The E2 InP layer of the emitter is etched (FIG. 4b). The $H_3PO_4$:HCl chemical solution is used, which has very high selectivity with the other semiconductors of the structure. The C2 InP layer of the collector is also partially etched (the C2 layer was chosen to be thicker than the E2 layer).

A photosensitive resin is used to perform lateral encapsulation 4 for protecting the remaining parts of the E2 emitter contact layer EC and the E2 layer, as well as of the metal contact. It should be noted that this encapsulation is made easier by the presence of the overhang in the emitter contact, in this case made from tungsten.

Deep underetching of the C2 InP collecting layer is performed (FIG. 4c). The $H_3PO_4$:HCl chemical solution is used, which has very high selectivity with the other semiconductors of the structure. The other layers are therefore not etched, in particular the two adjacent layers: that made from quaternary alloy, C1, and that made from InGaAs, C3. The E2 InP emitter layer is protected by the lateral photosensitive resin encapsulation.

The deep underetching is then encapsulated (FIG. 4d). The cavity made under the base overhang is filled with a material that has sufficiently low viscosity to fill the cavity, good adherence to semiconductor surfaces and the possibility of being hardened once in place to increase the mechanical strength of the base overhang. A photosensitive resin is used, for example, which is then polymerised by annealing at 170° C. for one hour. Other materials are also commercially available: polyimide, BCB, etc.

The E1 InGaAlAs layer of the emitter is etched (FIG. 4b). This layer is an integral part of the emitter (n-type). It must be removed in order to be able to deposit the ohmic contact on the base. A chemical solution is used (e.g. citric acid: $H_2O_2$) which selectively etches the InGaAlAs quaternary alloy in relation to the GaAsSb (the base layer must retain its initial thickness in order not to increase the access resistance of the base). The C3 InGaAs stop-etch layer of the collector is also etched during this etching. The C4 InP stop-etch layer of the collector is not etched. The lateral etching of the EI layer can be minimised so that the emitter finger is wider at the level of the E1 layer than at the level of the E2 layer. In these conditions, the excess thickness of the E1 layer is completely depleted of carriers, so that it has an action for reducing recombinations of minority electrons on the surface of the extrinsic base.

The C4 InP stop-etch layer of the collector is etched (FIG. 4f) to uncover the C5 collector contact layer where the ohmic contact of the collector will be deposited. The $H_3PO_4$:HCl chemical solution is used, which has very high selectivity with the other semiconductors of the structure (the other InP layers being protected). The transistors are electrically insulated by deep etching of the C5 and subjacent layers (not shown).

The ohmic contacts are deposited (FIG. 3g). The overhangs between the emitter and the base (due to the tapered shape of the contact) on the one hand and between the base and the collector on the other hand are used to make the base 5 and collector 6 contacts in one go (in the case of the emitter, this involves a thickening of the tungsten contact). This self-alignment makes it possible to reduce, in a controlled fashion, the distance between the base contact and the active zone of the transistor (typically between 100 and 200 nm). The metal deposit is optimised to reduce the contact resistance on the GaAsSb layer. A Pt/Ti/Pt/Au stack can be used for this purpose.

At this stage, the transistor is complete. It is then electrically connected to the contact outputs or to other components of the circuit. The previously described method requires a single photolithography. Entirely self-aligned, it allows, by overcoming the constraints caused by mask alignment machines, devices with largely submicronic dimensions to be produced at a low cost.

The invention claimed is:

1. A heterojunction bipolar transistor comprising:
an emitting layer having a first extension;
a base layer;
a collecting layer having a second extension smaller than the first extension;
said emitting and collecting layers epitaxially grown on a support surface and presenting a lack of lattice match;
at least one first underlayer in contact with said base layer, for balancing the constraints caused by said collecting layer; and
at least one second underlayer on the side opposite said base layer in relation to said first underlayer;
wherein said second underlayer is deeply underetched, creating a base layer overhang having a minimum lateral extension between the base and the emitting layer, the length of the second underlayer being smaller than the length of the base layer; and
a cavity defined under the base layer overhang is filled with a material that has sufficiently low viscosity to fill the cavity.

2. The transistor according to claim 1, wherein said first underlayer has substantially the same composition as said collecting layer.

3. The transistor according to claim 1, wherein said filling material is one of photosensitive resin, polyimide, or BCB.

4. The transistor according to claim 1, wherein said second underlayer is underetched to a minimum lateral extension comprised between that of the base and that of the emitter base junction.

5. The transistor according to claim 1, wherein the emitter layer has a thickness between 30 and 70 nm.

6. The method according to claim 1, wherein the cavity has a depth longer than the thickness of a layer being underetched.

7. A heterojunction bipolar transistor comprising:
an emitting layer;
a base layer;
a collecting layer;
said emitting and collecting layers epitaxially grown on a support surface and presenting a lack of lattice match;
at least one first underlayer in contact with said base layer, for balancing the constraints caused by said collecting layer; and
at least one second underlayer on the side opposite said base layer in relation to said first underlayer;
wherein said second underlayer is underetched, creating a base layer overhang, the length of the second underlayer being smaller than the length of the base layer; and
a cavity defined under the base layer overhang is filled with a material that has sufficiently low viscosity to fill the cavity, wherein
said base layer comprises GaAsSb,
said first underlayers comprise InGaAlAs; and
said second underlayers comprise InP.

8. A method for making a heterojunction bipolar transistor by stacking epitaxially grown semiconductor layers, comprising:
epitaxially growing from a support at least one collecting layer and one emitting layer respectively, at least one base layer, said collecting, base, and emitting layers having compositions producing a lattice match fault causing deformations, wherein the step of epitaxially growing said collecting layer and said emitting layer respectively further comprises sub-steps consisting of epitaxially growing, at least one first underlayer for balancing the constraints and reducing said deformations, and at least one second underlayer on the side opposite said base layer in relation to said first underlayer;
deep underetching a portion of said second underlayer to define a cavity having a minimum lateral extension between the base and the emitter base junction and a non-etched portion of the second underlayer;

filling the cavity formed by the underetching between said first underlayer of the collector and a layer adjacent the second underlayer with an insulating material; and etching said emitting layer.

9. The method for making a heterojunction bipolar transistor according to claim 8, further comprising forming a contact layer on the emitting layer and a metal contact; and encapsulating the emitting layer and metal contact in a material to protect them against etching.

10. The method for making a heterojunction bipolar transistor according to claim 9, wherein encapsulating the emitting layer and metal contact comprises encapsulating the non-etched portion of the second underlayer.

11. The method according to claim 9, wherein said emitting layer comprises first and second emitting underlayers in which a first emitting underlayer is in contact with the base layer and a second emitter underlayer is in contact with the opposite side of said first emitting underlayer, further comprising underetching a portion of the first emitting underlayer.

12. The method according to claim 8, in which said emitting layer comprises a first emitter underlayer in contact with the base layer and a second emitter underlayer in contact with said first emitter underlayer; further underetching the second emitter underlayer.

13. The method according to claim 12, wherein encapsulating the emitter layer includes encapsulating a non-etched part of the second emitter underlayer of the emitter.

14. The method according to claim 12, wherein said second emitter underlayer is underetched to a minimum lateral extension comprised between that of the base and that of the emitter-base and collector-base junction respectively.

15. The method according to claim 8, wherein said emitting layer comprises:

at least one first emitter underlayer in contact with said base layer having substantially the same composition as the emitting layer; and at least one second underlayer in contact with the opposite side of said first underlayer.

16. The transistor according to claim 8, wherein the emitter layer has a thickness between 30 and 70 nm.

17. The transistor according to claim 8, wherein the collector layer has a thickness between 100 and 200 nm.

18. The method according to claim 8, wherein deep underetching a portion of said second underlayer to define a cavity is deep underetching a cavity having a depth longer than a thickness of the portion of the second underlayer.

19. A method for making a heterojunction bipolar transistor by stacking epitaxially grown semiconductor layers, comprising:

epitaxially growing from a support at least one collecting layer and one emitting layer respectively, at least one base layer, said collecting, base, and emitting layers having compositions producing a lattice match fault causing deformations, wherein the step of epitaxially growing said collecting layer and said emitting layer respectively further comprises sub-steps consisting of epitaxially growing, at least one first underlayer for balancing the constraints and reducing said deformations, and at least one second underlayer on the side opposite said base layer in relation to said first underlayer;

deep underetching a portion of said second underlayer to define a cavity and a non-etched portion of the second underlayer;

filling the cavity formed by the underetching between said first underlayer of the collector and a layer adjacent the second underlayer with an insulating material; and etching said emitting layer, said emitting layer comprises a first emitter underlayer in contact with the base layer and a second emitter underlayer on an obverse side of said base layer in relation to said first emitter underlayer; further underetching the second emitter underlayer;

said base layer comprises GaAsSb;

said first underlayer comprises InGaAlAs; and said second underlayer comprises InP.

20. A method for making a transistor comprising:

epitaxially growing an emitting layer, an emitter underlayer, a collecting layer, and a collecting underlayer;

etching a layer above the emitting layer and a layer above the collecting layer;

deep underetching one of the emitter underlayer or collector underlayer to define a cavity;

filling the cavity left by said underetching with an insulating material;

etching said emitting layer to have a first extension: and etching the collecting layer to have a second extension less than the first extension.

21. The method according to claim 20, further comprising forming a transistor including a contact layer of the emitter and collector respectively and a metal contact, encapsulating said emitter contact and collecting contact respectively and the metal contact in a material to protect it against etching.

22. The transistor according to claim 20, wherein the emitter layer has a thickness between 30 and 70 nm.

23. The method according to claim 20, wherein deep underetching one of the emitter underlayer or collector underlayer is forming a cavity having a depth longer than the thickness of one of the emitter underlayer or collector underlayer.

24. A method for making a transistor comprising:

epitaxially growing an emitting layer, an emitter underlayer, a collecting layer, and a collecting underlayer;

etching a layer above the emitting layer and a layer above the collecting layer;

underetching one of the emitter underlayer or collector underlayer to define a cavity;

filling the cavity left by said underetching with an insulating material;

etching said emitting layer and collecting layer respectively; and forming a transistor in which said emitting layer and collecting layer respectively comprise two underlayers in which a first underlayer is in contact with the base layer and a second underlayer is on the side opposite said base layer in relation to said first underlayer, etching the layers above said emitting layer and collecting layer respectively is followed by a step consisting of etching the second underlayer of the emitter and collector respectively.

25. The method according to claim 21, wherein encapsulating said emitting contact and collecting contact respectfully includes encapsulating a non-etched portion of the second underlayer of the emitter and collector respectively.

* * * * *